(12) United States Patent
Wen et al.

(10) Patent No.: US 9,985,640 B1
(45) Date of Patent: May 29, 2018

(54) PROGRAMMABLE SEQUENCE CONTROLLER FOR SUCCESSIVE APPROXIMATION REGISTER ANALOG TO DIGITAL CONVERTER

(71) Applicant: Avnera Corporation, Beaverton, OR (US)

(72) Inventors: Jianping Wen, Beaverton, OR (US); Gordon Ueki, Portland, OR (US)

(73) Assignee: AVNERA CORPORATION, Beaverton, OR (US)

( * ) Notice: Subject to any disclaimer, the term of this patent is extended or adjusted under 35 U.S.C. 154(b) by 0 days. days.

(21) Appl. No.: 15/793,839

(22) Filed: Oct. 25, 2017

Related U.S. Application Data

(60) Provisional application No. 62/438,923, filed on Dec. 23, 2016.

(51) Int. Cl.
*H03M 1/38* (2006.01)
*H03M 1/10* (2006.01)
*H03M 1/46* (2006.01)

(52) U.S. Cl.
CPC ......... *H03M 1/1009* (2013.01); *H03M 1/462* (2013.01); *H03M 1/466* (2013.01)

(58) Field of Classification Search
CPC ..... H03M 1/462; H03M 1/466; H03M 1/1009

USPC .................................................. 341/161, 155
See application file for complete search history.

(56) References Cited

U.S. PATENT DOCUMENTS

| | | | |
|---|---|---|---|
| 9,473,144 B1* | 10/2016 | Thiagarajan | H03K 19/17736 |
| 9,531,400 B1* | 12/2016 | Wen | H03M 1/403 |
| 9,634,667 B2* | 4/2017 | Thiagarajan | H03K 19/017581 |
| 9,831,887 B2* | 11/2017 | Wen | H03M 1/38 |
| 2016/0065216 A1* | 3/2016 | Thiagarajan | H03K 19/0005 326/38 |

* cited by examiner

*Primary Examiner* — Lam T Mai
(74) *Attorney, Agent, or Firm* — Marger Johnson

(57) ABSTRACT

The disclosure includes an analog to digital converter (ADC) comprising a successive approximation register (SAR) unit including a capacitive network to take a sample of an analog signal and a comparator to approximate a digital value based on the analog signal sample via successive comparison. The disclosure also includes a programmable sequencer. The sequencer includes a control memory containing control signal states indicating control signals to operate the SAR unit. The sequencer also includes a program memory including sequence instructions defining a duty cycle for the SAR unit by referencing the control signal states in the control memory. The sequencer also includes a processing circuit to apply control signals according to the control signal states in an order defined by the sequence instructions to manage a sequence of operations at the SAR unit according to the duty cycle to control the ADC.

20 Claims, 10 Drawing Sheets

PROGRAMMABLE SEQUENCE CONTROLLER FOR SUCCESSIVE APPROXIMATION REGISTER ANALOG TO DIGITAL CONVERTER

CROSS-REFERENCES TO RELATED APPLICATIONS

The present application claims benefit from U.S. Provisional Patent Application Ser. No. 62/438,923, filed Dec. 23, 2016, and entitled "Programmable SAR Sequence Controller," which is incorporated herein by reference as if reproduced in entirety.

BACKGROUND

Analog to Digital Converters (ADCs) are employed in many technological areas. For example, an ADC may be employed to convert sound entering a microphone or light entering a receiver into a digital signal that can be stored and processed by a digital computing system. The conversion of an analog signal to a digital signal involves mapping a first set of values to a smaller second set of values, also known as quantization. Such quantization involves some level of truncation and/or rounding, which results in quantization error. Further, other ADC circuitry may inject noise into the signal during operation. Such error and noise negatively impact the Signal to Noise Ratio (SNR) of the ADC. Further, ADCs may operate in low power environments, for example when employed in systems operating from a battery. ADC circuits designed to maintain a high SNR for high quality conversion may drain significant power. Accordingly, balancing power consumption and SNR may dictate ADC design choices. Design choices that decrease power consumption without significantly decreasing SNR, or vice versa, may be beneficial.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Disclosed herein is a SAR ADC that converts analog signals to digital signals via successive approximation according to a duty cycle. Further, the SAR ADC is programmable to allow modification of the SAR ADC duty cycle as desired. The SAR ADC is controlled by one or more programmable SAR core sequencers. The Sar core sequencers each provide a controlling function for a corresponding SAR core operating at the edge of an analog domain. A SAR core sequencer is a micro-sequenced machine that coordinates the activities of SAR analog circuits. A Sar core sequencer is programmable and flexible, which allows the Sar ADC to be adapted to other ADC functions, for example as for use in system diagnostics. The sequencer includes a control memory that defines control signal states used to control the actions of the SAR ADC. The sequencer also includes a program memory that includes a sequence of instructions defining a duty cycle for the SAR unit by referencing the control signal states in the control memory. The sequencer obtains the sequence instructions from the program memory to obtain corresponding control signal states from the control memory. The sequencer then applies the control signals according to the control signal states. This allows the sequencer to be programmed by altering the data in the control memory and/or the program memory. Accordingly, the functionality of the SAR ADC can be changed, updated, patched, etc. as desired to tune the ADC for SNR and power consumption in various environments and under various conditions.

Figure 1:
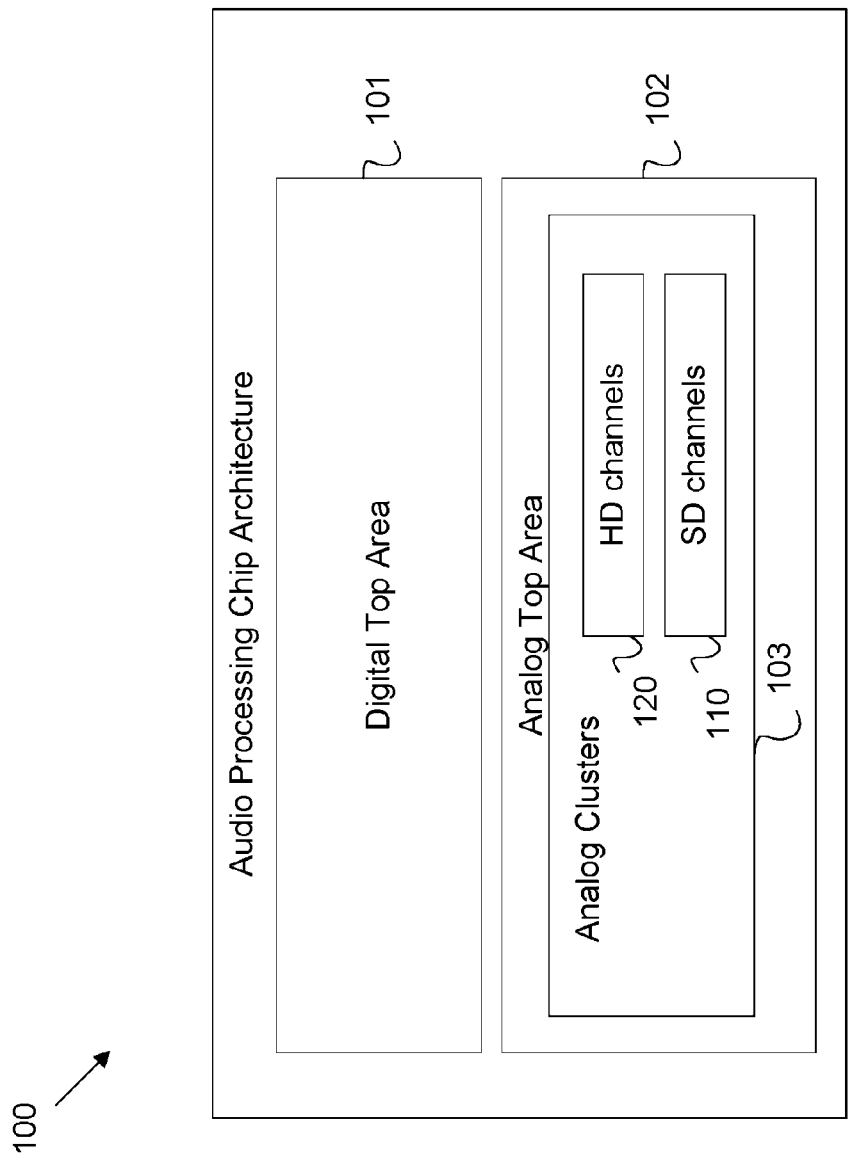
FIG. 1 is a schematic diagram of an example audio processing microchip architecture.

FIG. 1 is a schematic diagram of an example audio processing microchip architecture 100. Specifically, audio processing microchip architecture 100 is depicted as a multi-level conceptual hierarchy. The architecture 100 employs a digital top area 101. The digital top area 101 may encompass a sea-of-gates that implement various digital processing functions for operating an audio system, such as a set of headphones, as well as performing digital signal processing. The digital top area 101 may be described as a digital domain of the audio processing chip. The architecture 100 also employs an analog top area 102. The analog top area 102 encompasses an analog domain of the of the audio processing chip. The analog top area 102 contains various level shifters that support interfacing between the digital domain and the analog domain. The analog top area 102 organized into analog clusters 103, which are groups of related analog sub-systems. The analog clusters 103 include an ADC cluster for converting analog signals into digital signals. The ADC cluster includes audio channels that perform ADC functions on audio signals in the analog domain. In some examples, the ADC cluster includes six audio channels. The audio channels include full-performance High Definition (HD) channels 120 and area reduce Standard Density (SD) channels 110. In some examples, the audio processing microchip architecture 100 employs two HD channels 120 and four SD channels 110. The HD channels 120 are designated for carrying audio signals with high data density. For example, the HD channels 120 may include a left audio channel and a right audio channel for carrying audio signals for application to a user's left ear and right ear, respectively. The SD channels 110 are employed for carrying signals with lower data density, for example when less fidelity is desired. This allows the SD channels 110 to operate on a smaller area of a chip and employ less system complexity than the HD channels 120. The SD channels 110 may be employed to carry recorded data of ambient noise toward the digital top area 101 for use in active noise cancellation (ANC). ANC involves playing an inverse sound wave to the ambient noise in order to cancel ambient noise by destructive interference. In some examples, the chip may employ both feedback and feedforward ANC for each ear, for a total of four channels.

Figure 2:
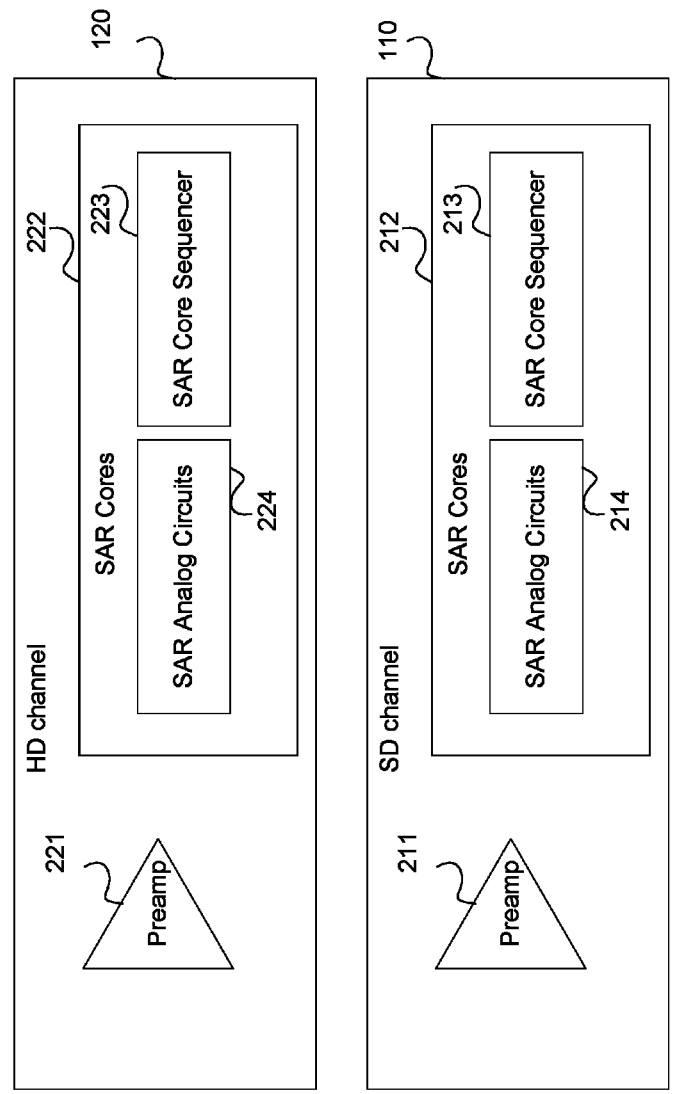
FIG. 2 is a schematic diagram of example audio channels in an audio processing microchip architecture.

FIG. 2 is a schematic diagram of example audio channels in an audio processing microchip architecture 100. The HD channel 120 includes at least one high-performance audio preamplifier 221. The audio preamplifier 221 is an amplifier for changing the gain of a corresponding audio signal carried by the HD channel 120. The HD channel 120 includes at least one SAR core 222 to digitize the corresponding audio signal. In some examples, the HD channel 120 includes three SAR cores 222 working together in a time-interleave fashion to digitize the audio signal. Employing multiple SAR cores 222 allows distributed processing of the signal. Specifically, each SAR core 222 operates on a different temporal portion of the signal, which results in an increased effective sample rate during ADC. The SAR cores 222 include SAR analog circuits 224 and a SAR core sequencer 223. The SAR core circuits 224 include various circuitry for sampling an analog signal and digitizing the samples according to successive approximation as discussed in more detail below. The SAR core sequencer 223 is a digital controller that controls the functionality, timing, duty cycle, etc. of the SAR analog circuits 224.

The SD channel 110 is similar to the HD channel 120. The SD channel 110 includes a reduced performance audio preamplifier 211. The audio preamplifier 211 is similar to audio preamplifier 221, but operates on less power and is less complex. For example, the HD channel 120 operates on higher fidelity signals. Hence, the audio preamplifier 221 should change signal levels rapidly to support high sampling rates, such as audio oversampling. Audio oversampling occurs above forty kilohertz (kHz), but may extend in the megahertz (MHz) range. The audio preamplifier 221 may support significant oversampling, while the audio preamplifier 211 may not significantly oversample. Further, HD audio signals may employ significantly variable audio levels, for example sudden changes from high volume to near silence. In contrast, SD signals may be more constrained in volume levels. Hence, the audio preamplifier 221 may include more gain range than the audio preamplifier 211. As such, the audio preamplifier 211 is less complex and powerful, but operates on a smaller chip space and functions on lower power than the audio preamplifier 221.

The SD channel 110 also includes a SAR core 212, which is similar to SAR cores 222. However, the SD channel 110 may employ a lower sampling rate, and may hence use a single SAR core 212 instead of a multi-core interleaving system. The SAR core 212 employs SAR analog circuits 214 and a SAR core sequencer 213, which are substantially similar to the SAR analog circuits 224 and the SAR core sequencer 223, respectively. Discussed below are various mechanisms that allow the SAR core sequencer 223 and/or 213 to be programmable. This in turns allows dynamic operation of the SAR analog circuits 224 and/or 214. As such, the functions of both SD channels 110 and HD channels 120 can be altered dynamically as desired by programming the SAR core sequencer 223 and/or 213.

Figure 3:
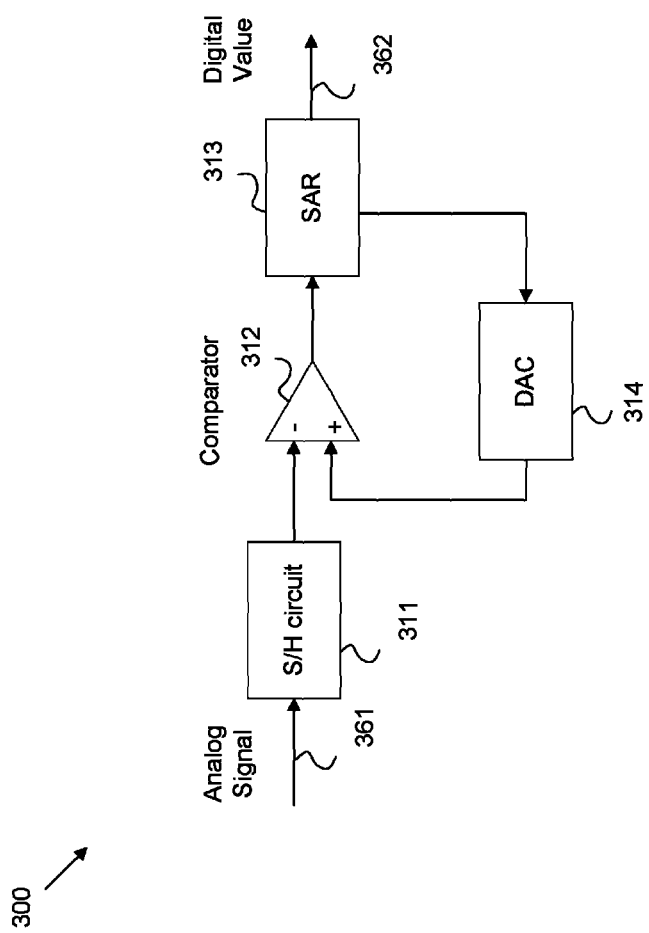
FIG. 3 is a schematic diagram of an example Successive Approximation Register (SAR) ADC architecture for audio processing.

FIG. 3 is a schematic diagram of an example SAR ADC architecture 300 for audio processing. Circuits operating according to SAR ADC architecture 300 may be employed as SAR analog circuits 224 and/or 214. Accordingly, an understanding of the operation of SAR ADC architecture 300 informs an understanding of the programable capabilities of a SAR core sequencer, such as SAR core sequencer 223 and/or 213.

The SAR ADC 300 includes a sample-hold circuit 311, a comparator 312, a SAR 313, and a Digital to Analog Converter (DAC) 314 coupled as illustrated. The sample-hold circuit 311 is coupled to an incoming analog signal 361. The sample-hold circuit 311 includes a plurality of capacitors of varying levels of capacitance, and in some implementations can be combined with DAC 314. The capacitors store charge from the analog signal 361 as a sample of the analog signal at a discrete instance in time. The SAR 313 may include a register for storing digital data as well as a circuit for providing known reference values. The DAC 314 is any device capable of converting a digital value to a corresponding analog signal value. The SAR 313 is configured to forward a known reference value (e.g. a one) via the DAC 314 to the comparator 312 for each bit of the sample. The comparator 312 is any electronic device capable of comparing two voltages and outputting an indication of which voltage is larger. The comparator 312 receives both voltage from the sample in the sample-hold circuit 311 and the known value from the SAR 313 via the DAC 314. The comparator 312 then indicates which value is larger. The result of the comparison is stored in the SAR 313 as a bit of a corresponding digital value 362. As such, the sample-hold circuit 311 may include a capacitor/capacitor group for storing a portion of the analog signal for each bit desired in the digital value 362. The SAR ADC 300 may then iteratively test the electrical charge from each group of capacitors in the sample-hold circuit 311 against the known value from the SAR 313 on a bit by bit basis. The results are stored in the SAR 313. Once all the desired bits have been tested, the resulting digital value 362 may be forwarded from the SAR ADC 300 into a digital domain for further use by coupled systems.

Figure 4:
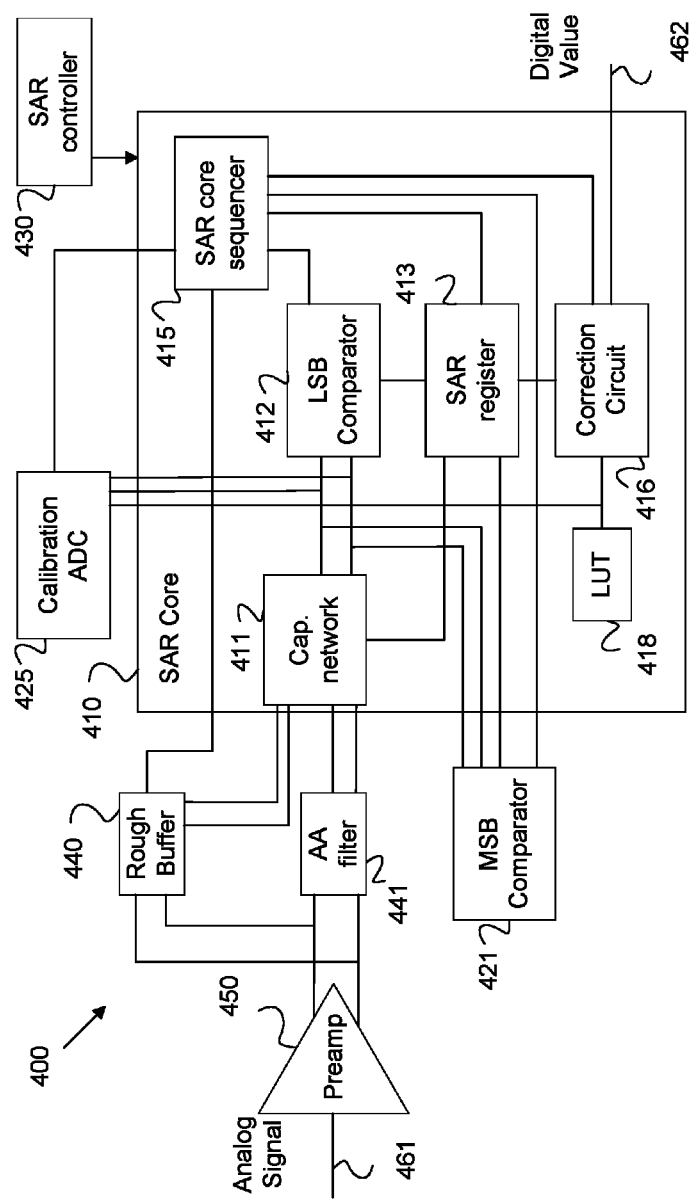
FIG. 4 is a schematic diagram of an example SAR core network.

FIG. 4 is a schematic diagram of an example SAR core network 400, which may be employed to implement a SAR ADC architecture, such as SAR ADC 300 architecture. Further, the SAR core network 400 may be employed to implement an ADC function in an HD channel 120 and/or an SD channel 110. The SAR core network 400 may comprise at least one SAR core 410, but may also employ a plurality of SAR cores 410 in some examples. A group of one or more SAR cores 410 may be referred to herein as a SAR unit for clarity of discussion. The SAR core 410 receives and samples an analog signal 461 and outputs corresponding digital value(s) 462.

The SAR core network 400 includes a preamplifier 450 coupled to the SAR core 410. The preamplifier 450 may be employed to implement a preamplifier 221 and/or 211. A preamplifier 450 is any electronic device that alters the gain of an electrical signal for further processing. For example, the preamplifier 450 may amplify the analog signal 461 for application to a capacitive network 411 in the SAR core 410 for sampling. The capacitive network 411 may be substantially similar to sample-hold circuit 311, DAC 314, or combinations thereof. Hence, the capacitive network 411 may take a sample of the analog signal 461, as amplified, and store the sample for approximation as a digital value 462. Hence, the capacitive network 411 may be referred to as a sample and hold circuit. The analog signal 461 may be forwarded via an anti-aliasing (AA) filter 441, which is any filter for mitigating signal distortion.

During operation, the SAR core 410 may take multiple samples. Hence, the capacitive network 411 may be discharged after a sample has been approximated, and then charged again when taking the next sample. Employing the preamplifier 450 to repeatedly charge the capacitive network 411 may place significant design constraints on the preamplifier 450. For example, quickly providing a sufficient and exact amount of charge to the capacitive network 411 may result in signal distortion, high power usage, and/or require a complex amplifier design. To mitigate such issues, the SAR core network 400 may include a rough buffer 440 to pre-charge the capacitive network 411 of the SAR core 410 prior to application of the analog signal 461 from the preamplifier 450. The rough buffer 440 may be any controllable voltage/current (e.g. charge) source. The rough buffer 440 pre-charges the capacitive network 411 to an approximate value (e.g. ninety percent) of the analog signal. The preamplifier 450 then provides sufficient power to adjust the charge in the capacitive network 411 up to the level of the analog signal 461. The amount of charge provided by the rough buffer 440 may be selected as an amount of charge that is lower than the amount of charge employed during a previous sample cycle. The SAR core 410 may spend a significant portion of an overall duty cycle approximating the digital value 462 from the sample. Hence the preamplifier 450 and the rough buffer 440 may be powered down when not in use to conserve power. Further, in embodiments that employ multiple SAR cores 410 in a SAR unit, the SAR cores 410 may share access to the preamplifier 450 and/or the rough buffer 440. Further, when many SAR cores 410 are employed (e.g. six) and a significant portion of the system duty cycle involves charging phases (e.g. about ⅙) the rough buffer may remain powered constantly, which may eliminate powering up/down transients.

Once the analog signal 461 has been sampled by the capacitive network 411, the SAR core 410 may employ comparators to approximate digital value(s) 462 based on the analog signal 461 sample via successive comparison. For example, each SAR core 410 may contain a Least Significant Bit (LSB) comparator 412 and may be coupled to a Most Significant Bit (MSB) comparator 421. The LSB comparator 412 and the MSB comparator 421 may be substantially similar to comparator 312. For example, the comparators 412 and 421 may each contain internal preamplifiers and a latch, which can be activated to make a comparison between inputs. The MSB comparator 421 determines a most significant bit for each digital value 462. The LSB comparator 412 then determines the remaining least significant bits. The MSB comparator 421 may be shared between multiple SAR cores 410 in some examples. The MSB comparator 421 is subject to more significant signal swings than the LSB comparator 412 because a switch of the first digit may cause twice the signal swing of a next digit (e.g. the most significant LSB). Signal swings may result in leakage current in attendant system circuits. Large signal swings may amplify such leakage currents, which may result in distortion and/or increased power usage. As such, the MSB comparator 421 selects the MSBs outside of the SAR core(s) 410 to mitigate signal swings and attendant leakage current. As with other shared components, the MSB comparator 421 may only be powered when determining MSBs for the SAR core(s) 410. The MSB comparator 421 may be powered down when not in use to conserve power.

The SAR core 410 may also include a SAR register 413, which may be substantially similar to SAR 313. The SAR core 410 may operate by accepting a sample of the analog signal at the capacitive network 411, which may a combination of a sample hold circuit and DAC. The most significant bit of the sample is forwarded from the MSB comparator 421 to the SAR register 413, which drives the capacitive network 411 to compare the sample against a DAC reference level determined by SAR register 413. The result is stored in the SAR register 413. Such process is then repeated for each successive LSB at the LSB comparator 421, with the results stored in the SAR register 413 as an approximated digital value 462. The SAR core 410 may include a SAR core sequencer 415, which may be a digital control circuit configured to control the components of SAR core 410 in order to enact the sampling and successive approximation sequence. Specifically, the SAR core sequencer 415 may implement a SAR core sequencer 213 and/or 223. The SAR core sequencer 415 may manage the duty cycle for the SAR core 410 by sending signals to the SAR core 410 components for each clock cycle according to signal states in a finite state machine as discussed in more detail below. The SAR core 410 may be implemented as any form of control processor, for example as an Application Specific Integrated Circuit (ASIC), a Field Programmable Gate Array (FPGA), a Digital Signal Processor (DSP), a general purpose processor, and/or any other control circuit.

Capacitors may vary in capacitance due to variations in manufacturing processes. The SAR core network 400 includes a calibration ADC 425, a correction circuit 416, and a capacitor weight Lookup Table (LUT) 418 acting as a calibration circuit to correct for such variations. The calibration ADC 425 supports determination of an array of capacitor weight values for capacitors in the capacitive network 411. The calibration ADC 425 may be a delta sigma modulation ADC. During a calibration sequence, the calibration ADC 425 may forward known reference values to the capacitive network 411. The SAR register 413 and the correction circuit 416 may then test the amount of charge on each capacitor in the capacitive network 411 against expected values. The correction circuit 416 may employ the test results to determine an array of capacitor weight values for the capacitors in the capacitive network 411. The capacitor array of capacitor weight values is stored in the capacitor weight LUT 418. During SAR operation, the correction circuit 416 may generate digital signal values 462 based on the approximate digital values stored in the SAR register 413 and the capacitor weight values in the capacitor weight LUT 418. The capacitor weight LUT 418 may be any memory component, such as cache, Read Only Memory (ROM), Electrically Erasable Programmable Read-Only Memory (EEPROM), flash memory, etc. The correction circuit 416 may be configured from any logic circuit capable of determining capacitor weight values and determining digital values 462 based on the capacitor weight values and the results from the SAR register 413. For example, the correction circuit 416 may include an ASIC, a FPGA, a DSP, a general purpose processor, etc. It should also be noted that the calibration ADC 425 may be shared between multiple SAR cores 410. Further, the calibration ADC 425 may be powered down during the SAR process (e.g. when the calibration process is not active) to save power.

As noted above, the network 400 may include a SAR unit with a plurality of SAR cores 410. Hence, each of the SAR cores 410 include a capacitive network 411, an LSB comparator 412, a SAR register 413, a correction circuit 416, a LUT 418, and a SAR core sequencer 415. Such SAR cores 410 may be configured to operate in parallel by sampling the analog signal 461 at different points in the SAR core network 300 duty cycle (e.g. interleaving). For example, a first SAR core 410 may take a first sample of the analog signal 461 and begin a SAR process on the first sample. A second SAR core 410 may then take a second sample of the analog signal 461 while the first SAR core 410 is processing the first sample. A third SAR core 410 may then take a third sample of the analog signal 461 while the first SAR core 410 and the second SAR core 410 are processing the first and second samples, respectively. The digital values 462 from the SAR cores 410 may then be interleaved into a digital signal. The SAR core network 400 also include a SAR controller 430 to manage this process. The SAR controller 430 may be coupled to the SAR unit including the cores 410. The SAR controller 430 may initiate the SAR process on each core 410 in an offset manner by communicating with the SAR core sequencers 415. The SAR controller 430 may also manage interleaving the digital values 462 from the SAR cores 410 into a digital signal corresponding to the analog signal 461. The SAR controller 430 may include an ASIC, a FPGA, a DSP, a general purpose processor, etc.

It should be noted that the SAR core sequencer 415 may operate at a different clock rate from the SAR controller and the rest of the digital domain. The digital ADC SAR controller 430 may initiate a sample conversion by asserting a clock synchronization signal. The raw SAR data may be returned to the digital ADC controller as digital values 462, serially two bits at a time together with two bits of status. The raw data may be bit-weight corrected into a usable digital value. The SAR controller 430 may control the conversion rate and phasing by interleaving multiple SAR cores 410. Conversion rate may be determined by the repetition rate of the clock synchronization signal. In some cases, the SAR controller 430 may issue a single clock synchronization in order to achieve a single conversion as might be desired for diagnostics. Further, multiple SAR cores 410 in a channel can be interleaved to achieve higher sample rates. The SAR controller 430 can achieve this by controlling the repetition rate and phasing of the clock synchronization signal sent to each of the SAR cores 410. As a specific example, multiple SAR cores 410 may begin converting samples with an offset between each core starting cycle, such as a four cycle offset, an eight cycle offset, a sixteen cycle offset, a thirty two cycle offset, etc.

Figure 5:
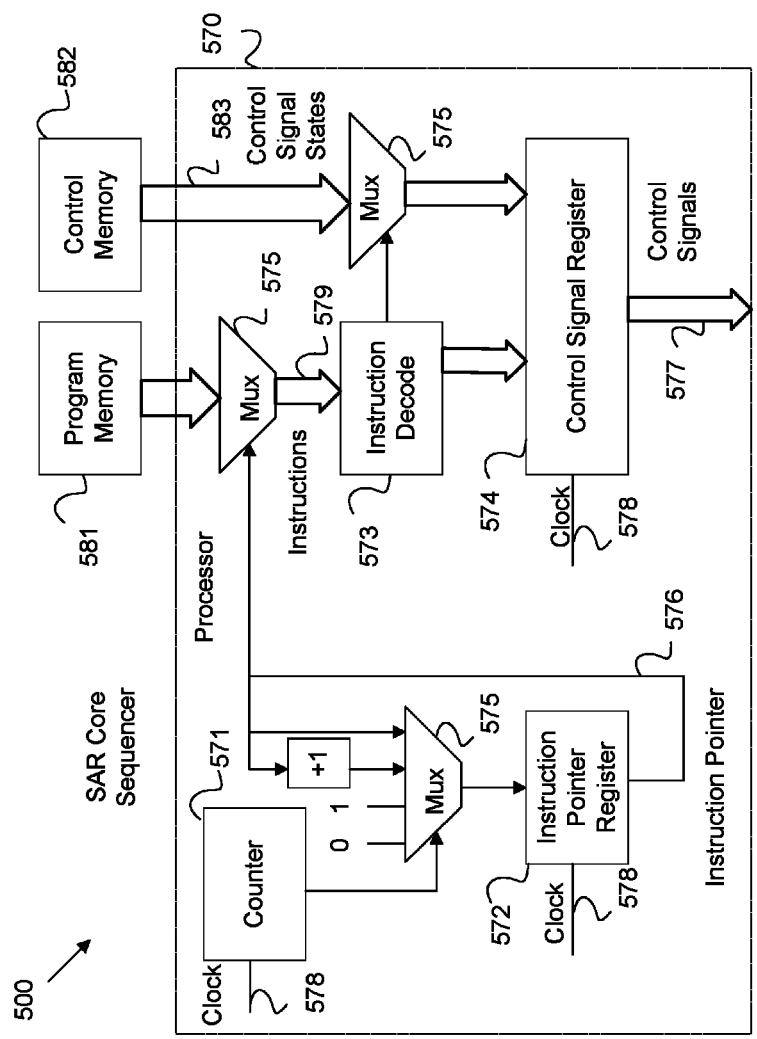
FIG. 5 is a schematic diagram of an example SAR core sequencer.

FIG. 5 is a schematic diagram of an example SAR core sequencer 500. SAR core sequencer 500 may be employed to implement a SAR core sequencer 213, 223, and/or 415 and hence may control the operation of a corresponding SAR core in an HD channel or an SD channel. SAR core sequencer 500 is a programmable sequencer configured to implement a finite state machine, and hence control the operation of SAR core when performing ADC.

The SAR core sequencer 500 includes a program memory 581. The program memory 581 holds the code to implement a conversion sequence. In some examples, the program memory 581 is six bits wide, to accommodate a corresponding instruction size, and sixteen locations deep to accommodate a corresponding number of instructions. The instructions may call a corresponding control signal state to indicate a set of control signals for application to the SAR core. In some examples, location zero is not programmable and implicitly holds an idle instruction. The remainder of memory may include a total of ninety bits. The program memory 581 may be programmable via an Advanced Peripheral Bus (APB) register and/or via a direct bus from the digital sea of gates as fifteen eight-bit registers. Accordingly, the program memory 581 contains sequence instructions defining a duty cycle for the SAR unit. The program memory 581 may be implemented according to any memory technology, such as by a register, cache, random access memory (RAM), solid state memory, etc.

Figure 7:
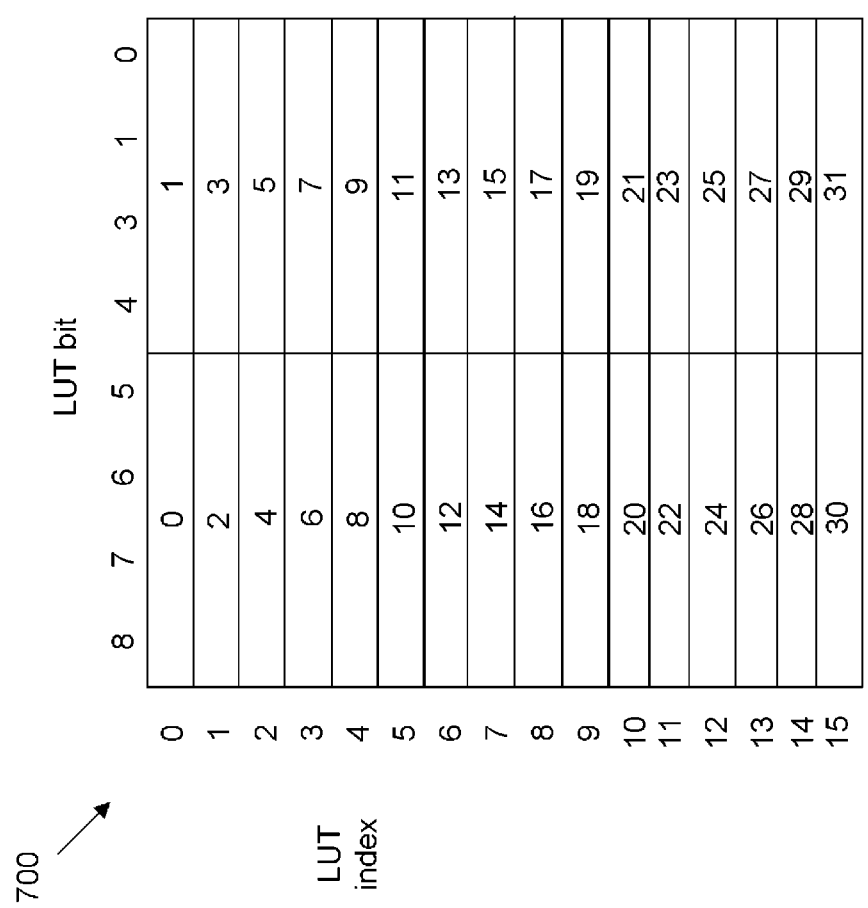
FIG. 7 is a schematic diagram of an example control memory Lookup Table (LUT).

The SAR core sequencer 500 also includes a control memory 582. The control memory 582 may be implemented as a lookup table (LUT). The control memory 582 holds a mapping of LUT indices to control signal states 583 to be implemented by a control signal register 574. As such, the control signal states 583 in the LUT can be referenced by the instructions in the program memory 581 via the indices to create a sequence of signal states, and hence a program to define a duty cycle of a SAR unit. Depending on the instruction type, the index into the control memory 582 may be implied or explicitly specified by instruction. In some examples, the control memory 582 supports sixteen indices and nine control signals for a total of one hundred forty-four bits. This control memory 582 may be written indirectly through APB registers and/or via a direct bus from the digital sea of gates. FIG. 7 shows an example organization of the control memory 582 with respect to how the control memory is written by an eight bit APB register. The control memory 582 may be implemented according to any memory technology, such as by a register, cache, RAM, solid state memory, etc.

The SAR core 500 also includes a processing circuit 570. The processing circuit 570 is configured to employ the sequence instructions from the program memory 582 to obtain the control signal states from the control signal register 574. The processing circuit 570 also applies control signals to the SAR unit/core according to the control signal states in an order defined by the sequence instructions. This allows the processing circuit 570 to manage a sequence of operations at the SAR unit according to the duty cycle to control analog to digital conversion via successive approximation. The processing circuit 570 may include circuitry, as discussed below, to support the forgoing functionality.

The processing circuit 570 may include a counter 571. The counter 571 receives a clock signal 578 as an input. The clock signal 571 may be denoted as clk_sar and may be a core controller driven clock. The counter 571 may include both a duration counter and a repetition counter in some examples. The duration counter 571 may be four bits. The duration counter 571 counts a number of clock cycles in an instruction execution. In some examples, instructions disclosed here may be completed in one cycle. However, BIT1X and BITMX instructions as discussed below, may employ an arbitrary number of cycles (e.g. up to sixteen) as set by an APB register. The repetition counter may also be four bits, and counts the number of repetitions in a BITM and/or a BITMX instruction. Those instructions specify a repetition count which allows one instruction to otherwise replace N identical instructions.

The processing circuit 570 may also include multiplexers 575. A multiplexer 575 is an electronic device that receives a plurality of inputs and a control input. The multiplexer 575 then outputs one or more of the inputs based on a signal from the control input. The multiplexers 575 are coupled as shown.

The processing circuit 570 may further include an instruction point register 572. The instruction point register 572 may be implemented according to any memory technology, such as by a register, cache, RAM, solid state memory, etc. The instruction point register 572 maintains an instruction pointer 576 into program memory 581 for the current instruction being executed. In some examples, two instruction locations are deemed special. Location zero implicitly holds an Idle instruction and location one contains a conversion start instruction. The instruction pointer 576 advances linearly from zero until the execution of a Last instruction, which causes a branch back to either location zero or location one. It should be noted that the Last instruction is denoted by a specific opcode and is not required to be location in the last memory position. For example, a first multiplexer 575 may receive a zero, one, current instruction pointer 576, and a next instruction pointer (e.g. instruction pointer 576 plus one) as an input.

The counter 571 controls the first multiplexer 575 based on the clock 578. The output of the first multiplexer 575 selects an instruction pointer 576 from the instruction point register 572 based on the output of the first multiplexer 575 at a clock edge from a clock signal 578.

A second multiplexer 575 and a third multiplexer 575 receive instructions 579 from the program memory 581 and control signal states 583 from the control memory 582, respectively. The instruction pointer 576 iterates through instructions 579 from the program memory 581 according to the instruction sequence. An instruction decode 573 circuit decodes corresponding instructions and controls the third multiplexer 575. The third multiplexer 575 then outputs the selected control signal states 583 from the control memory 582 based on the decoded instruction.

The processing circuit 570 may further include a control signal register 574. The control signal register 574 may be implemented according to any memory technology, such as by a register, cache, RAM, solid state memory, etc. The control signal register 574 outputs groups of control signals 577 corresponding to each control signal state 583. The control signal register 574 outputs the control signals 577 corresponding to the instruction 579 from the program memory 581 and the control signal states 583 from the control memory 582. The control signals 577 then control the SAR core/unit.

Figure 6:
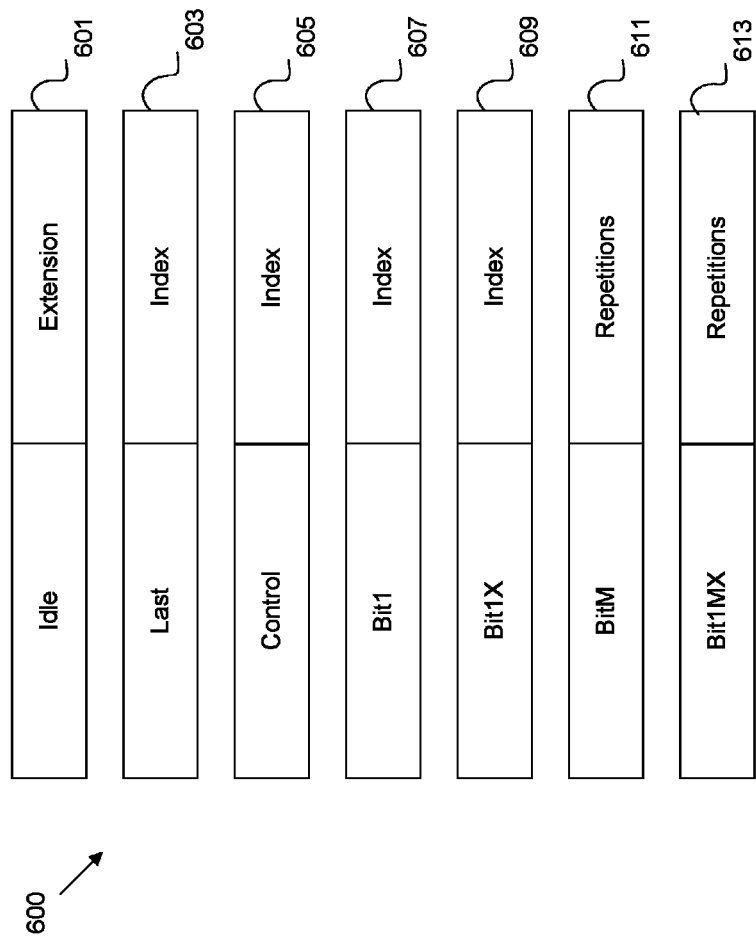
FIG. 6 illustrates example sequence instructions for operating a SAR core sequencer.

The instructions 579 include an opcode and an extension. In some examples, the opcode is two bits and the extension is four bits. The opcode indicates the corresponding instruction 579, and the extension indicates any desired control signal states corresponding to the instruction and/or relevant control state data. FIG. 6 illustrates example sequence instructions 600 for operating a SAR core sequencer, such as SAR core sequencer 500.

The sequence instructions 600 include an idle (IDLE) instruction 601 denoted by a corresponding opcode and extension. The IDLE instruction 601 sets the SAR unit into an inactive state. The IDLE instruction 601 may be implied at an address zero in program memory. The IDLE instruction 601 may maintain the SAR unit in an idle state for one or more clock cycles. The sequence may then advance to the next address when a clock synchronization is received. The IDLE instruction 601 may not contain an index to control memory because the control output signals are set to an inactive state when the IDLE instruction 601 is being executed.

The sequence instructions 600 include a last (LAST) instruction 603 denoted by a corresponding opcode and index. The LAST instruction 603 is for general control signal sequencing at the end of a sample conversion. The LAST instruction 603 may contain a control index set to one. Rather than advancing the instruction pointer, the LAST instruction 603 includes an implied branch to either location zero or one based on the presence of a synchronizing clock. In other words, the LAST instruction 603 causes the system to return to a location with an IDLE instruction 601 to wait for a clock synchronization signal from a SAR controller when the clock synchronization signal is not present or return to the first non-idle instruction if the clock signal from the SAR controller has been received. This allows the SAR controller to control interleaving between multiple SAR sequencers controlling multiple SAR cores. The LAST instruction 603 may take one clock cycle. In other words, the LAST executes a control signal state at a corresponding location in a control signal register as a final instruction in a duty cycle and returns to a defined location in program memory. Further, the LAST instruction 603 allows the SAR sequencer to receives a clock synchronization (ck_sync) signal from a SAR controller, and place the SAR unit into an inactive state until the ck_sync signal is received to support SAR unit interleaving over a plurality of processing cores.

The sequence instructions 600 include a control (CTRL) instruction 605 denoted by a corresponding opcode and index. The CTRL instruction 605 is employed for general control signal sequencing. The CTRL instruction 605 may take one clock cycle. Further, the CTRL instruction 605 accepts a programmable index into the control memory. The index may be specified in the four least significant bits (LSB) of the instruction. By changing the index, the CTRL instruction 605 can reference different commands in the control memory, which results in corresponding signal states being activated in the control signal register. The CTRL instruction 605 then causes the SAR core sequencer to advance one address. Hence, the CTRL instruction 605 executes a control signal state indexed at a corresponding location in the control memory.

The sequence instructions 600 may also include one or more bit decision (BIT) instructions and corresponding opcodes to store one or more results of the comparator as one or more bits of the digital value. Further, the BIT instructions may initiate a shift signal to shift a SAR register in the SAR unit to a next memory location after the bit is determined. The BIT instructions may be employed for testing purposes. For example, the sequence instructions 600 may include a one bit decision (BIT1) instruction 607 for sequencing through a SAR bit decision sequence. The BIT1 instruction 607 may not have a fixed control index and thus may be useful in the case of the first and last bit decisions, which could employ controls different from the signal configuration than the intermediate bit decision cycles. The BIT1 instruction 607 is single cycle and a shift output is asserted during execution. The BIT1 instruction 607 includes an index specified by the three LSBs of the instruction, and hence encode a range of zero to seven in binary. The BIT1 instruction 607 then advances to a current address plus one upon completion. In other words, the BIT1 instruction stores the result of the comparator as a single bit of a digital value.

The sequence instructions 600 may also include majority of decisions for a single bit decision (BIT1X) instruction 609. The BIT1X instruction 609 is substantially similar to the BIT1 instruction 607, except that the bit decision is extended from a single cycle into a specified number of cycles. The number of cycles (X) may be specified by a bit_duration value in the APB register set. Extending the bit decision allows for the implementation of the majority-of-n-compares algorithm. The shift output is asserted in the last cycle. In other words, the BIT1X instruction 609 stores a majority of results of the comparator for a single bit of the digital value over a defined number of clock cycles.

The sequence instructions 600 may also include a multiple bit decision (BITM) instruction 611. The BITM instruction 611 is employed for sequencing through the SAR bit decision sequence. This instruction may output the control signals specified by index zero in the control memory. The BITM instruction 611 executes one to sixteen bit decision operations as specified by the number of bits extension field (e.g. 0 to 15). Each bit decision operation is single cycle and a shift is asserted during execution. Hence, the BITM instruction 611 executes in R+1 cycles where R is the extension field set to any of zero to fifteen. In other words, the BITM instruction stores the results of the comparator for a defied number of bits of the digital value.

The sequence instructions 600 may also include a majority of decisions for multiple bits (BITMX) instruction 613. The BITMX instruction 613 is substantially similar to the BITM instruction, except that each bit decision takes X cycles, where X is specified by the bit_duration value in the APB register set. Extending the bit decision allows for the implementation of the majority-of-n-compares algorithm. A shift output is asserted in the last cycle of each bit. The repetition field still applies, and the extension applies to each of those repetitions. The BITMX instruction 613 executes (R+1) * bit_duration cycles. In other words, the (BITMX) instruction 613 stores a majority of results of the comparator for each of a defied number of bits of the digital value.

FIG. 7 is a schematic diagram of an example control memory LUT 700, which can implement a control memory, such as control memory 582. The LUT 700 includes rows of indices and columns of bits. However, the rows and columns could be swapped in some examples. The bits encode a control signal state by indicating corresponding control signals to activate when an index is called by an instruction from program memory (e.g. according to instructions 600). The LUT 700 can be written via an APB register. As noted above, the number of indices correspond to the number of signal states that can be programmed on the sequencer for use in controlling the corresponding SAR core. Each bit of a signal state indicates whether a corresponding signal is activated when the index is selected by the program memory. In an example, the control memory LUT 700 contains nine bits that are mapped to control signals as shown in table 1 below:

TABLE 1

| LUT data bit | Analog Core Control Signal |
| --- | --- |
| 8 (MSB) | sync (internal) |
| 7 | pup_rough_buf |
| 6 | pup_comp |
| 5 | pup_msb_comp |
| 4 | pup_latch |
| 3 | sample |
| 2 | sample_rough |
| 1 | clear |
| 0 (LSB) | rtz |

The synchronization (sync) signal is used internally to send a synchronization status to the correction logic (e.g. correction circuit 416). Accordingly, the sync signal flags the start of a new sample. The sync signal is generally sent immediately prior to the first bit instruction in a sample conversion. In other words, a correction circuit is employed to generate a digital signal value based on an approximate digital value and an array of capacitor weight values. Hence, the control signal states include a synchronization sync signal to synchronize the correction circuit with the SAR unit.

The power up rough buffer (pup_rough_buf) signal is employed to initiate a rough buffer (e.g. rough buffer 440) to pre-charge the capacitive network. Hence pup_rough_buf may be employed at the end of a first sample conversion in order to prepare for a second sample conversion.

The power up comparator (pup_comp) signal is employed to power up a LSB comparator (e.g. LSB comparator 412) in order to compare LSB values of the analog signal sample against known values. The pup_comp signal may be employed during an MSB comparison to prepare for an LSB comparison and maintained throughout conversion of a sample. The pup_comp signal may then be de-asserted to save power between sample conversions.

The power up most significant bit comparator (pup_msb_comp) signal is employed to power up a MSB comparator (e.g. MSB comparator 421) to compare a MSB value of the analog signal sample against a known values. The pup_msb_comp signal may be employed immediately prior to determining an MSB of a sample, for example while a sample of the analog signal is taken, and then de-asserted during LSB comparison in order to save power. It should be noted that the MSB comparator may be shared between SAR cores, and hence multiple sequencers may power the MSB up and down at different points of the system duty cycle in a time interleave manner.

The power up latch (pup_latch) signal is employed to power up a latch in the at least one comparator to output a comparison result. Hence, pup_latch signal may be asserted for each bit of a digital value during sample conversion.

The sample signal is employed initiate the capacitive network in order to accept a charge for the analog signal sample (e.g. from the preamplifier 450). Further, the sample rough (sample_rough) signal is employed to initiate the capacitive network to accept a pre-charge from a rough buffer (e.g. from the rough buffer 440). Hence, the sample_rough is employed to pre-charge the capacitive network, for example at the end of a sample conversion of a previous sample. The sample signal is then employed to cause the capacitive network to obtain the actual sample value of the analog signal.

The clear signal is employed to reset the SAR register (e.g. SAR register 413) in the SAR unit in preparation for approximating a next digital value. In other words, the clear signal is employed after the digital value has been forwarded off of the SAR core for use by other systems. The clear signal removes the converted digital value to make space for the next digital value. The return to zero (rtz) signal is employed to clear any dependent charge from the at least one capacitive network in preparation for pre-charging the next sample. For example, rtz may ensure that charge from a previous high amplitude sample does not impact a next small amplitude signal.

It should be noted that the shift control signal, which shifts between memory locations after each bit conversion may not represented in the LUT 700. The shift signal may instead be generated at the end of each repetition of a BIT instruction.

Accordingly, by combining the program memory 581 and the control memory 582, a sequencer can be programmed to control a SAR ADC core. In other words, the instructions from the program memory 581 can be written define a sequence by indexing the control states. The control states can then be programmed to encode the desired control signals. The control signal register can then generate the control signals based on the control states and the instructions. Table 2 below illustrates an example duty cycle for a SAR core performing an ADC conversion on a sample based on the abovementioned signal states.

TABLE 2

| State | Event |
| --- | --- |
| 0 | 1. Signal sample is synchronized to the rising edge of the clock that is aligned to a rising edge of a crystal clock. Synchronized signal is the internal sample_sync of analog core, which is sent to comparator to enable sampling feedback loop; <br> 2. Pulse sample_rough asserts, which connects bottom plates of sampling capacitors to rough charger output. pup_comp asserts to power up LSB comparator. |

TABLE 2-continued

| State | Event |
|---|---|
| 1 | 1. Pulse sample_rough de-asserts, which connects bottom plates of sampling capacitors to anti-aliasing filter output;<br>2. Pulse pup_msb_comp asserts to power up the MSB comparator. |
| 2 | 1. Pulse clear asserts, which resets all SAR bits to zero.<br>2. Pulse sample de-asserts. |
| 3 | 1. Signal sample is synchronized to sample_sync, which disables sampling feedback loop;<br>2. Pulse shift asserts, which enables the shift of SAR bit at each clock rising edge;<br>3. Pulse clear de-asserts, which arms all SAR bits;<br>4. Pulse pup_rough_buf de-asserts, which powers down rough buffer;<br>5. Pulse pup_latch asserts, which enables comparator to latch the result at the next cycle.<br>6. MSB comparator makes decision, which sets the MSB cap polarity. |
| 4~20 | 1. Comparator makes decision for bits b16~b0.<br>2. At cycle 4, pulse pup_comp_msb de-asserts, which powers down MSB comparator.<br>3. At cycle 20, pulse pup_comp de-asserts, which powers down SAR comparator. |
| 21 | 1. Pulse shift de-asserts, which disables the shift of SAR bit at the next clock rising edge.<br>2. Pulse pup_latch de-asserts, which disables comparator clock. |
| 22 | 1. Pulse rtz asserts, which clears the signal dependent charge in capacitor array. |
| 23 | 1. Pulse rtz de-asserts;<br>2. Pulse pup_rough_buf asserts, which powers up rough buffer preparing for charging the sampling cap;<br>3. Pulse sample asserts, which is synchronized to the clock at the next cycle. |

Tables 3-4 below illustrate example sequencer instructions in a program memory and signal states in a control memory, respectively, that results in the functionality described in Table 2.

TABLE 3

| Memory Address | Instruction | State | LUT index |
|---|---|---|---|
| 0 | Idle | Idle | N/A |
| 1 | Control, 8 | State 22 | 8 |
| 2 | Control, 9 | State 23 | 9 |
| 3 | Control, 10 | State 0 | 10 |
| 4 | Control, 11 | State 1 | 11 |
| 5 | Control, 12 | State 2 | 12 |
| 6 | Bit1, 2 | State 3 | 2 |
| 7 | BitM, 15 | States 4-19 | 0 |
| 8 | Bit1, 3 | State 20 | 3 |
| 9 | Last | State 21 | 1 |

TABLE 4

| | Index | | | | | | | | |
|---|---|---|---|---|---|---|---|---|---|
| Signal | 8 | 9 | 10 | 11 | 12 | 2 | 0 | 3 | 1 |
| sync | 0 | 0 | 0 | 0 | 0 | 1 | 0 | 0 | 0 |
| Pup_rough_buf | 0 | 1 | 1 | 1 | 1 | 0 | 0 | 0 | 0 |
| Pup_comp | 0 | 0 | 1 | 1 | 1 | 1 | 1 | 0 | 0 |
| Pup_msb_comp | 0 | 0 | 0 | 1 | 1 | 1 | 0 | 0 | 0 |
| Pup_latch | 0 | 0 | 0 | 0 | 1 | 1 | 1 | 1 | 0 |
| sample | 0 | 1 | 1 | 1 | 0 | 0 | 0 | 0 | 0 |
| Sample_rough | 0 | 0 | 1 | 0 | 0 | 0 | 0 | 0 | 0 |
| clear | 0 | 0 | 0 | 0 | 1 | 0 | 0 | 0 | 0 |
| rtz | 1 | 0 | 0 | 0 | 0 | 0 | 0 | 0 | 0 |

Table 2 above describes a general SAR process that repeats twenty four cycles. There may be cases where the cores are operated differently. For example, a SAR process may cycle once and then enter an idle state while waiting for a next conversion command. As another example, for debugging purpose, the polarity of a particular bit can be measured a pre-defined number of times and the average result of the comparator decisions used to determine the polarity of that bit.

It should be noted that the sequencer (e.g. SAR core sequencer 415 and/or 500) configuration and program code (e.g. in program memory 581 and control memory 582) may be subject to certain constraints as discussed below. For example, the total loop execution time (e.g. time to convert a sample to a digital value) may be limited by the desired sample rate. The SAR controller (e.g. SAR controller 430) may assert ck_sync at a specified rate and phasing. The sequencer should be in a position to start the next sample conversion when ck_sync is asserted to support interleaving, for example by executing idle or last instructions. If ck_sync is asserted and the sequencer is not in the position to start a new conversion cycle, the sample may be skipped and the sample overrun flag set. Accordingly, the execution time though the conversion loop, from the start to last instruction, may be completely deterministic and may be verified to operate in a manner that is consistent with the desired sample rate.

Further, the sample signal should be deasserted corresponding to a specified edge of the analog clock, because jitter of one clock edge may be larger than that of the other, and the end of sample phase should happen at a cleaner analog clock edge. Hence, the deassertion of sample signal from the sequencer should occur at the specified phase of the analog clock or the sample deassert error flag is set. The execution time from the start to the deassertion of sample is completely deterministic. Hence, the program should be adjusted to make the deassertion occur at the specified phase of the digital clock or the analog clock synchronization can be deferred for one clock period by setting a sync delay flag.

As another example, the total loop execution time may be an even number. In some examples, an additional consequence of the above rising edge clock settings is that conversion start occurs at a known phase of the analog clock. As a result the loop time be a multiple of two. If the loop is not a multiple of two clock phases, the conversion loop then includes the idle instruction at the cost of one or more additional cycles to align sequencer to the specified edge of the clock from the digital domain.

Further, the SAR analog core may generate and report MSB bit decisions differently from non-MSB decisions. As a result, the sequencer may distinguish between the MSB cycle and non-MSB cycles. The sequencer may make this distinction by employing the sync control signal. Hence, the first bit cycle following the assertion of the sync control may be treated as the MSB. It should also be noted that, in some examples, the majority bit decision circuitry may not be incorporated into the MSB path. If that is the case, and the BIT1X or BITMX instruction is used for the MSB, the last bit comparison may be registered as the MSB bit decision.

Figure 8:
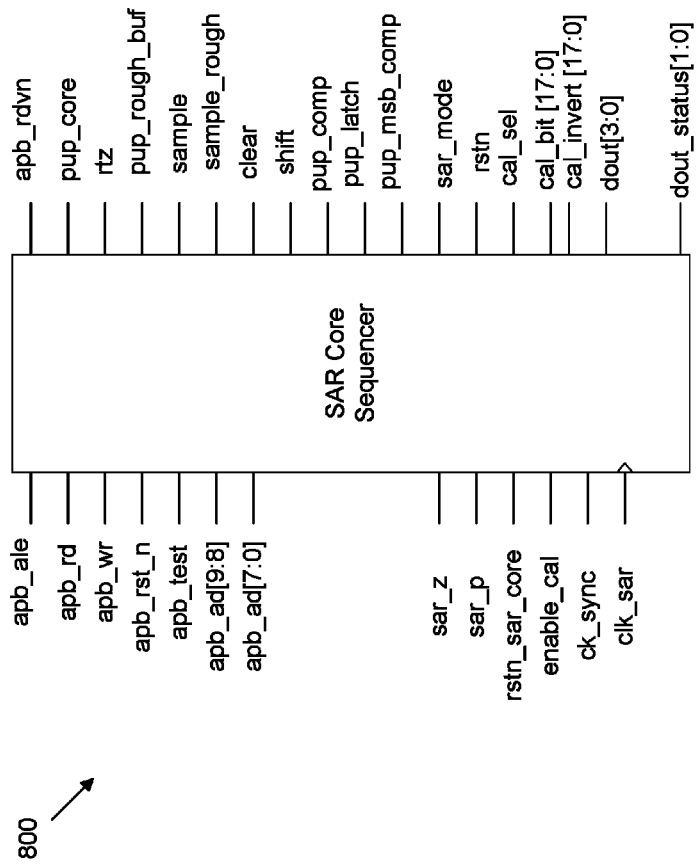
FIG. 8 is a pinout diagram of an example SAR core sequencer.

FIG. 8 is a pinout diagram 800 of an example SAR core sequencer, such as SAR core sequencer 415 and/or 500. The SAR core sequencer receives various input signals from an APB bus including APB address latch enable (apb_ale), APB read enable (apb_rd), APB write enable (apb_wr), APB reset active low (apb_rst_n), APB test enable (apb_test), and APB address data (apb_ad). The SAR core sequencer also outputs to the APB register an APB read valid (apb_rdvn_o). The APB interface allows an APB register to program the SAR sequencer by changing the values in the program memory and the control memory. Such signals are defined by the APB bus. For example, the apb_rst_n allows the APB bus to cause the sequencer to reset the analog core to a known state. Other SAR sequencer configuration changes that may be made by the APB bus includes initiating a start delay to delay ADC by a clock cycle for clock phase alignment. Further, the APB bus may employ a sample phase configuration change to assert the phase of the digital domain clock to be employed to control sampling, a violation of which may set a sample deassert error flag. Flags accessible by the APB bus include a running flag that indicates when the sequencer is operating, the sample deassert error flag that indicates when a sample signal is deasserted in violation of the sample phase configuration, and a conversion overrun flag indicated when a clock signal indicating sample start is received prior to completion of a last instruction. Other APB related controls include a run enable command to cause the sequencer to begin controlling ADC sample conversion, a sequencer reset command to reset the sequencer to a known state, and an error clear command to clear error flags (e.g. sample deassert error and conversion overrun).

The SAR core sequencer also receives other inputs such as calibration enable (enable_cal), reset SAR core sequencer/controller (rstn_sar_core), SAR z value (sar_z), SAR p value (sar_p), SAR core clock (clk_sar), and synchronization system clock (ck_sync). The enable_cal input toggles the SAR sequencer between a calibration mode to set values for a correction circuit (e.g. correction circuit 416) and a SAR mode for performing SAR ADC. The rstn_sar_core input is employed to reset the sequencer, for example a restart after a program change. The SAR core sequencer may employ an intermediate trilevel system when converting from analog to digital, and sar_z and sar_p support conversion from trilevel values to binary values. The clk_sar input is the clock signal used by the SAR core, while the ck_sync input is a clock signal from the sea of gates in the digital domain that is employed to synchronize multiple SAR cores. For example, ck_sync may be employed to interleave starting times of sample conversions at the various SAR cores.

The SAR core sequencer also employs various outputs. For example, the SAR core sequencer employs data output (dout) and data status (dout_status) outputs to the digital domain. The dout represents two bit decisions (e.g. sar_p and sar_z for two bits) which is passed to the correction logic in the sea of gates, together with dout_status which indicates when dout is valid or invalid.

The SAR core sequencer also outputs control signals to the analog domain to control the SAR process. Such outputs include pup_rough_buf, pup_comp, pup_msb_comp, pup_latch, sample, sample_rough, clear, and rtz which operate as discussed with respect to FIG. 7. The SAR core sequencer also outputs a shift output to move the SAR register (e.g. SAR register 413) to a next memory location after determining each bit.

The SAR core sequencer also outputs additional control signals to the analog domain that are unrelated to the SAR process. Such outputs include power up core (pup_core), SAR mode (sar_mode), reset SAR registers (rstn), calibration select (cal_sel), calibration bit (cal_bit), and calibration invert (cal_invert). The pup_core output powers up the analog core of the SAR ADC. The sar_mode output toggles the SAR core between calibration mode and SAR mode based on the enable_cal input. The rstn output resets the SAR analog core based on rstn_sar_core. The cal sel output indicates when the analog core is actively selected for calibration. The cal_bit includes an 18-bit vector passed to SAR analog core for calibration to select calibration bit(s) during the calibration process. The cal_invert is employed by the SAR analog core to conditionally invert portions of the calibration bit select vector during calibration.

Figure 9:
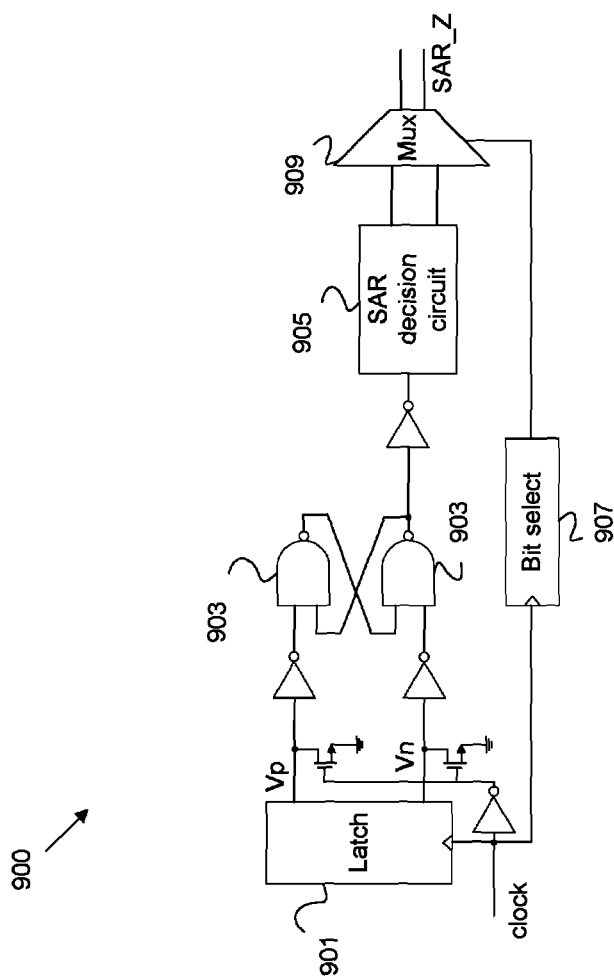
FIG. 9 is a schematic diagram of an example comparator metastability circuit.

FIG. 9 is a schematic diagram of an example comparator metastability circuit 900, which may be employed in a SAR core network, such as SAR core network 400 to handle metastability concerns. Metastability occurs when a value considered by a comparator is approximately in the center of the comparators range. For instance, a comparator that outputs either positive one or negative one experiences metastability concerns at about zero. In such a case, the comparator may be unable to quickly settle to either output value as neither is clearly correct. Under this condition, a decision of positive one or negative one may not be particularly important, as long as the sequencer and analog core employ the same value. The metastability circuit 900 may be employed to ensure a comparator to a sequencer (e.g. comparator 421 and/or 412 and SAR core sequencer 415 and/or 500, respectively) employ a consistent value in such cases.

The comparator metastability circuit 900 includes a latch 901, a set-reset (SR) latch 903, a SAR decision circuit 905, a bit select circuit 907, and a Mux 909 coupled as shown. The latch 901 may be included in a LSB comparator 412 or a MSB comparator 421. The SR latch 903 is a bistable device that may be built of not and (nand) or not or (nor) logic gates. The SAR decision circuit 905 may include a SAR register 413 and correction circuit 416. The bit select circuit 907 may be implemented by the SAR core sequencer 415.

The comparator latch 901 outputs voltage positive (Vp) and voltage negative (Vn). Vp/Vn start to regenerate at the rising edge of clk_sar. Under normal conditions, the regeneration takes about one to two nanoseconds (ns) to complete and trip an output at the SR latch 903 without ambiguity. At the falling edge of clk_sar, the comparator output SR latch 903 enters a keep state. The output of the SR latch 903 then propagates to the SAR decision logic 905 and is set to a correct value at the Mux 909 at the next rising edge of clk_sar.

When an input to the comparator latch 901 is on a trip point at a rising edge of clk_sar, Vp/Vn may not resolve within 5 ns (e.g. the pulse width of clk_sar). At the falling edge of clk_sar, the comparator output SR latch 903 should regenerate from the unresolved differential input Vp/Vn. In some examples, the SR latch 903 has about thirty five ns to resolve in order to avoid a case where the sequencer from receives the wrong value. An SR latch 903 that employs logic gates as shown is unlikely to maintain an unstable condition for more than fifteen ns. Hence, thirty five ns is long enough for SR latch 903 to settle an avoid an incorrect value. It some examples, 500 picoseconds (ps) is the delay from rising edge of clk_sar to mux 909 output update. This is the hold time for sequencer to clock in the previous bit.

In addition to metastability, which is related to system setup times, hold times are also considered. In order to maintain hold time conditions sample, shift and clear are synchronized to the rising edge of the analog domain clock. The clock edge delay from the analog clock to synchronization of sample, shift, and clear may be about 60-160 ps with routing parasitic capacitances included. The clock edge delay inside the analog domain may not exceed 500 ps, which allows for a 1 ns hold time by the sequencer, while maintaining a margin with a factor of two. Taken together, the setup time may take about five ns for a bit decision, with a hold time of about a half a ns.

Figure 10:
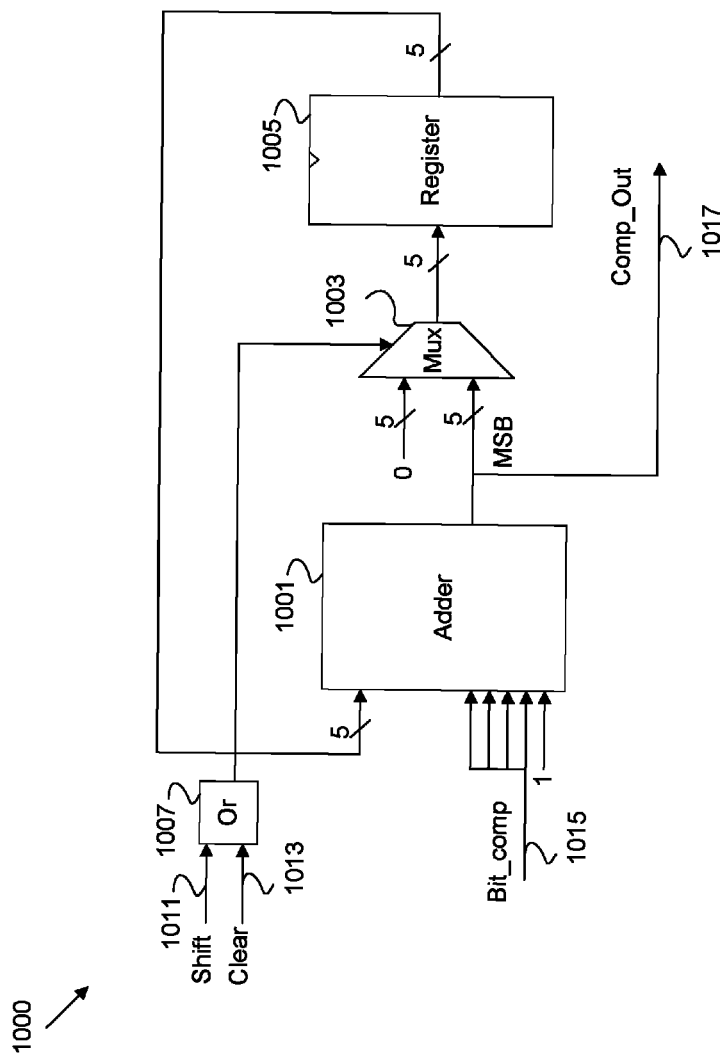
FIG. 10 is a schematic diagram of an example comparison majority circuit.

FIG. 10 is a schematic diagram of an example comparison majority circuit 1000. The comparison majority circuit 1000 includes a register 1005, which may be implemented by SAR register 413, and an adder 1001 and an or gate 1007, which may be implemented by logic in the SAR core 410. The comparison majority circuit 1000 receives a clear signal 1013 and a shift signal 1011 at the or gate 1007. The clear signal 1013 and shift signal 1011 are provided by the sequencer (e.g. sequencer 570). The adder 1001 also receives the bit(s) to be compared as a bit comparison (bit_comp) signal from the relevant comparator (e.g. LSB comparator 412 and/or MSB comparator 421).

The SAR sequencer employs the comparison majority circuit 1000 to support a majority-of-N type of comparison. Each repetition of the BIT1X and/or BITMX instruction produces N compare results from the SAR core, where N is a value specified in the sequencer program memory. The comparison logic, within the SAR analog block, may employ the adder 1001 as up-down counter to keep track of the net count of high or low compare results. The adder 1001 yields a majority decision as a comparison output (comp_out) signal which the SAR logic may take as the final bit decision.

To perform this functionality, the sequencer asserts clear prior to the first BIT instruction. The clear signal 1013 forces the count value to zero. Each cycle examines the comparator output bit_comp which either adds +1 (e.g. 00001) or −1 (e.g. 11111) to the count value, depending on a current bit decision. When the repetition of N cycles of the bit decision ends, the MSB of the count is the majority decision. The shift signal 1011 is then asserted causing the SAR to register that decision as a final decision and zero the count in preparation for the next bit. The shift signal 1011 is used to accept the current bit decision from the Analog Core. The shift signal 1011 may be asserted for one clock period per bit decision. In the case of a BIT1X or BITMX instruction, The shift signal 1011 may be asserted in the last clock period for a particular bit. The bit decision may be sampled the cycle following the assertion of the shift control.

Examples of the disclosure may operate on a particularly created hardware, on firmware, digital signal processors, or on a specially programmed general purpose computer including a processor operating according to programmed instructions. The terms "controller" or "processor" as used herein are intended to include microprocessors, microcomputers, Application Specific Integrated Circuits (ASICs), and dedicated hardware controllers. One or more aspects of the disclosure may be embodied in computer-usable data and computer-executable instructions (e.g. computer program products), such as in one or more program modules, executed by one or more processors (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as Random Access Memory (RAM), Read Only Memory (ROM), cache, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer readable media excludes signals per se and transitory forms of signal transmission. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

EXAMPLES

Illustrative examples of the technologies disclosed herein are provided below. An embodiment of the technologies may include any one or more, and any combination of, the examples described below.

Example 1 includes an analog to digital converter (ADC) comprising: a successive approximation register (SAR) unit including at least one capacitive network to take a sample of an analog signal and at least one comparator to approximate a digital value based on the analog signal sample via successive comparison; and a programmable sequencer including: a control memory containing control signal states indicating control signals to operate the SAR unit; a program memory including sequence instructions defining a duty cycle for the SAR unit; and a processing circuit to: employ the sequence instructions from the program memory to obtain the control signal states from the control memory; and apply control signals according to the control signal states in an order defined by the sequence instructions to manage a sequence of operations at the SAR unit according to the duty cycle to control analog to digital conversion via successive approximation.

Example 2 includes the ADC of Example 1, wherein the sequence instructions includes an idle (IDLE) instruction to set the SAR unit to an inactive state.

Example 3 includes the ADC of Examples 1-2, wherein the sequence instructions includes a control (CTRL) instruction to execute the control signal state at a corresponding location in the control memory.

Example 4 includes the ADC of Examples 1-3, wherein the sequence instructions includes a last (LAST) instruction to execute the control signal state at a corresponding location in the control memory as a final instruction in the duty cycle and return to a defined location in program memory.

Example 5 includes the ADC of Example 4, wherein the programmable sequencer receives a clock synchronization (ck_sync) signal from a SAR controller, the LAST instruction placing the SAR unit into an inactive state until the ck_sync signal is received to support SAR unit interleaving over a plurality of processing cores.

Example 6 includes the ADC of Examples 1-5, wherein the sequence instructions includes one or more bit decision (BIT) instructions to store one or more results of the comparator as one or more bits of the digital value.

Example 7 includes the ADC of Example 6, wherein the BIT instructions include a one bit decision (BIT1) instruction to store the result of the comparator as a single bit of the digital value.

Example 8 includes the ADC of Examples 6-7, wherein the BIT instructions include a majority of decisions for a single bit (BIT1X) instruction to store a majority of results of the comparator for a single bit of the digital value over a defined number of clock cycles.

Example 9 includes the ADC of Examples 6-8, wherein the BIT instructions include a multiple bit decision (BITM) instruction to store results of the comparator for a defied number of bits of the digital value.

Example 10 includes the ADC of Examples 6-9, wherein the BIT instructions include a majority of decisions for multiple bits (BITMX) instruction to store a majority of results of the comparator for each of a defied number of bits of the digital value.

Example 11 includes the ADC of Examples 6-10, wherein the BIT instructions initiate a shift signal to shift a SAR register in the SAR unit to a next memory location.

Example 12 includes the ADC of Examples 1-11, further comprising a correction circuit to generate a digital signal value based on the approximate digital value and an array of capacitor weight values, the control signal states including a synchronization (sync) signal to synchronize the correction circuit with the SAR unit.

Example 13 includes the ADC of Examples 1-12, wherein the control signal states includes a power up rough buffer (pup_rough_buf) signal to initiate a rough buffer to pre-charge the capacitive network.

Example 14 includes the ADC of Examples 1-13, wherein the control signal states includes a sample rough (sample_rough) signal to initiate the at least one capacitive network to accept a pre-charge from a rough buffer.

Example 15 includes the ADC of Examples 1-14, wherein the control signal states includes a sample signal to initiate the at least one capacitive network to accept a charge for the analog signal sample.

Example 16 includes the ADC of Examples 1-15, wherein the control signal states includes a power up comparator (pup_comp) signal to power up a Least Significant Bit (LSB) comparator to compare LSB values of the analog signal sample against known values.

Example 17 includes the ADC of Examples 1-16, wherein the control signal states includes a power up most significant bit comparator (pup_msb_comp) signal to power up a Most Significant Bit (MSB) comparator to compare a MSB value of the analog signal sample against a known values.

Example 18 includes the ADC of Examples 1-17, wherein the control signal states includes a power up latch (pup_latch) signal to power up a latch in the at least one comparator to output a comparison result.

Example 19 includes the ADC of Examples 1-18, wherein the control signal states includes a clear signal to reset a SAR register in the SAR unit in preparation for approximating a next digital value.

Example 20 includes the ADC of Examples 1-19, wherein the control signal states includes a return to zero (rtz) signal to clear dependent charge from the at least one capacitive network.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. An analog to digital converter (ADC) comprising:
   a successive approximation register (SAR) unit including at least one capacitive network to take a sample of an analog signal and at least one comparator to approximate a digital value based on the analog signal sample via successive comparison; and
   a programmable sequencer including:
      a control memory containing control signal states indicating control signals to operate the SAR unit;
      a program memory including sequence instructions defining a duty cycle for the SAR unit; and
      a processing circuit to:
         employ the sequence instructions from the program memory to obtain the control signal states from the control memory; and
         apply control signals according to the control signal states in an order defined by the sequence instructions to manage a sequence of operations at the SAR unit according to the duty cycle to control analog to digital conversion via successive approximation.

2. The ADC of claim 1, wherein the sequence instructions includes an idle (IDLE) instruction to set the SAR unit to an inactive state.

3. The ADC of claim 1, wherein the sequence instructions includes a control (CTRL) instruction to execute the control signal state at a corresponding location in the control memory.

4. The ADC of claim 1, wherein the sequence instructions includes a last (LAST) instruction to execute the control signal state at a corresponding location in the control memory as a final instruction in the duty cycle and return to a defined location in program memory.

5. The ADC of claim 4, wherein the programmable sequencer receives a clock synchronization (ck_sync) signal from a SAR controller, the LAST instruction placing the SAR unit into an inactive state until the ck_sync signal is received to support SAR unit interleaving over a plurality of processing cores.

6. The ADC of claim 1, wherein the sequence instructions includes one or more bit decision (BIT) instructions to store one or more results of the comparator as one or more bits of the digital value.

7. The ADC of claim 6, wherein the BIT instructions include a one bit decision (BIT1) instruction to store the result of the comparator as a single bit of the digital value.

8. The ADC of claim 6, wherein the BIT instructions include a majority of decisions for a single bit (BIT1X) instruction to store a majority of results of the comparator for a single bit of the digital value over a defined number of clock cycles.

9. The ADC of claim 6, wherein the BIT instructions include a multiple bit decision (BITM) instruction to store results of the comparator for a defied number of bits of the digital value.

10. The ADC of claim 6, wherein the BIT instructions include a majority of decisions for multiple bits (BITMX) instruction to store a majority of results of the comparator for each of a defied number of bits of the digital value.

11. The ADC of claim 6, wherein the BIT instructions initiate a shift signal to shift a SAR register in the SAR unit to a next memory location.

12. The ADC of claim 1, further comprising a correction circuit to generate a digital signal value based on the approximate digital value and an array of capacitor weight values, the control signal states including a synchronization (sync) signal to synchronize the correction circuit with the SAR unit.

13. The ADC of claim 1, wherein the control signal states includes a power up rough buffer (pup_rough_buf) signal to initiate a rough buffer to pre-charge the capacitive network.

14. The ADC of claim 1, wherein the control signal states includes a sample rough (sample_rough) signal to initiate the at least one capacitive network to accept a pre-charge from a rough buffer.

15. The ADC of claim 1, wherein the control signal states includes a sample signal to initiate the at least one capacitive network to accept a charge for the analog signal sample.

16. The ADC of claim 1, wherein the control signal states includes a power up comparator (pup_comp) signal to power up a Least Significant Bit (LSB) comparator to compare LSB values of the analog signal sample against known values.

17. The ADC of claim 1, wherein the control signal states includes a power up most significant bit comparator (pup_msb_comp) signal to power up a Most Significant Bit (MSB) comparator to compare a MSB value of the analog signal sample against a known values.

18. The ADC of claim 1, wherein the control signal states includes a power up latch (pup_latch) signal to power up a latch in the at least one comparator to output a comparison result.

19. The ADC of claim 1, wherein the control signal states includes a clear signal to reset a SAR register in the SAR unit in preparation for approximating a next digital value.

20. The ADC of claim 1, wherein the control signal states includes a return to zero (rtz) signal to clear dependent charge from the at least one capacitive network.

* * * * *